United States Patent
Bond et al.

(10) Patent No.: US 6,629,046 B1
(45) Date of Patent: Sep. 30, 2003

(54) AUTOMATIC SERVICE TYPE RECOGNITION IN ELECTRICAL UTILITY METER

(75) Inventors: Randal K. Bond, West Lafayette, IN (US); Christopher L. Anderson, Granger, IN (US); Robert E. Slaven, Lafayette, IN (US)

(73) Assignee: Siemens Power Transmission & Distribution, Inc., Wendell, SC (US)

( * ) Notice: Subject to any disclaimer, the term of this patent is extended or adjusted under 35 U.S.C. 154(b) by 0 days.

(21) Appl. No.: 09/397,351

(22) Filed: Sep. 16, 1999

Related U.S. Application Data (63) Continuation of application No. 08/690,973, filed on Aug. 1, 1996, now Pat. No. 6,112,158.

(51) Int. Cl.⁷ .............................................. G01R 21/06
(52) U.S. Cl. .......................................... 702/61; 702/90
(58) Field of Search ............................... 702/57, 60–65, 702/79–81, 90, 189; 324/74, 76.11, 76.77, 86, 110, 500

(56) References Cited

U.S. PATENT DOCUMENTS

| | | |
|---|---|---|
| 4,200,933 A | 4/1980 | Nickel et al. |
| 4,734,639 A | 3/1988 | Saletta et al. |
| 4,884,021 A | 11/1989 | Hammond et al. |
| 4,977,515 A | 12/1990 | Rudden et al. |
| 4,979,122 A | 12/1990 | Davis et al. |
| 5,017,860 A | 5/1991 | Germer et al. |
| 5,059,896 A | 10/1991 | Germer et al. |
| 5,245,275 A | 9/1993 | Germer et al. |
| 5,258,704 A | 11/1993 | Germer et al. |
| 5,302,890 A | 4/1994 | McEachern et al. |
| 5,325,051 A | 6/1994 | Germer et al. |
| 5,457,621 A * | 10/1995 | Munday et al. .......... 363/21.16 |
| 5,469,049 A | 11/1995 | Briese et al. |
| 5,497,332 A | 3/1996 | Allen et al. |
| 5,537,029 A | 7/1996 | Hemminger et al. |
| 5,544,089 A | 8/1996 | Hemminger et al. |
| 5,548,527 A | 8/1996 | Hemminger et al. |
| 5,602,744 A | 2/1997 | Meek et al. |
| 5,621,629 A | 4/1997 | Hemminger et al. |
| 5,631,554 A * | 5/1997 | Briese et al. ............ 324/76.77 |
| 6,094,622 A * | 7/2000 | Hubbard et al. ............... 702/61 |
| 6,112,158 A * | 8/2000 | Bond et al. ...................... 702/61 |
| 6,128,584 A * | 10/2000 | Hemminger et al. .......... 702/75 |
| 6,141,626 A * | 10/2000 | Holdsclaw et al. ........... 702/60 |
| 6,185,508 B1 * | 2/2001 | Van Doorn et al. ........... 702/60 |

* cited by examiner

Primary Examiner—Marc S. Hoff
Assistant Examiner—Craig Steven Miller
(74) Attorney, Agent, or Firm—Maginot, Moore & Bowman (57) ABSTRACT

Disclosed is a method and arrangement for use in an electrical utility meter, the electrical utility meter operable to be connected to a plurality of electrical service types. The arrangement is operable to identify a present service type, the present service type being one of the plurality of electrical service types to which the electrical utility meter is connected. The arrangement comprises: conversion circuit for obtaining measured voltage magnitude and phase angle data for a plurality of phases in a polyphase electrical system; a memory; and a processor connected to said memory and said conversion circuit. The processor is operable to execute programming steps stored in the memory to receive the measured voltage magnitude and phase angle data from the conversion circuit and identify the present electrical service type based on the measured voltage magnitude and phase angle data.

15 Claims, 6 Drawing Sheets

| METER FORM | SERVICE TYPE | ROTATION | Va | PHASE A | Vb | PHASE B | Vc | PHASE C |
|---|---|---|---|---|---|---|---|---|
| 9s | 4WY-120v | ABC | 120 | 0 | 120 | 120 | 120 | 240 |
| | 4WY-277v | ABC | 277 | 0 | 277 | 120 | 277 | 240 |
| | 4WY-120v | CBA | 120 | 0 | 120 | 240 | 120 | 120 |
| | 4WY-277v | CBA | 277 | 0 | 277 | 240 | 277 | 120 |
| | 4WY-120v | ABC | 60 | 0 | 60 | 180 | 104 | 90 |
| | 4WY-240v | ABC | 120 | 0 | 120 | 180 | 208 | 90 |
| | 4WY-480v | ABC | 240 | 0 | 240 | 180 | 416 | 90 |
| | 4WY-120v | CBA | 60 | 0 | 60 | 180 | 104 | 270 |
| | 4WY-240v | CBA | 120 | 0 | 120 | 180 | 208 | 270 |
| | 4WY-480v | CBA | 240 | 0 | 240 | 180 | 416 | 270 |

FIG. 6

AUTOMATIC SERVICE TYPE RECOGNITION IN ELECTRICAL UTILITY METER

This is a continuation of U.S. patent application Ser. No. 08/690,973 filed Aug. 1, 1996, now U.S. Pat. No. 6,112,158.

FIELD OF THE INVENTION

The present invention relates generally to electrical utility meters, and in particular, electrical utility meters for use in polyphase power configurations.

BACKGROUND OF THE INVENTION

Electrical utility service providers, or simply utilities, monitor energy usage by customers through electrical utility meters. Electrical utility meters track the amount of energy consumed, typically measured in kilowatt-hours ("kwh"), at each customer's facility. The utility uses the consumption information primarily for billing, but also for resource allocation planning and other purposes.

Most utilities generate polyphase electrical power, and typically three phase power. Polyphase electrical power is alternating current electrical power that is supplied on a plurality of power supply lines wherein the voltage waveform on each of the power supply lines has a unique phase angle. While only a single phase of the polyphase electrical power is typically provided for single family dwellings, true polyphase electrical power is typically provided to larger facilities such as commercial and industrial facilities.

Polyphase electrical power is provided to customers in a plurality of configurations, known as service types. A service type is typically defined by the nominal voltage level and a wiring configuration. A wiring configuration is further defined by the number of wires (three wire or four wire) and the wiring relationship between the phases (wye or delta). For example, a 120 volt four wire service type has a nominal voltage level of 120 volts and a four wire wye wiring configuration. The most commonly-used service types are standardized and are well-known to those of ordinary skill in the art.

Different standard watt-hour meter types, known as meterforms, are used to measure the power consumption for the various service types. Meter forms are distinguished by, among other things, the method by which they determine the amount of consumed power. The consumed power determination method used by a particular meter form is generally appropriate for some service types but not for others. The meter form that is appropriate for use in a particular customer facility also depends on a number of other factors, including: the maximum level of current expected; the accuracy needed; cost; and whether the wiring configuration has a common neutral. The commonly-used meter forms include those designated as 5S, 45S, 6S, 36S, 9S, 16S, 12S and 25S meter forms.

The trend of the metering industry has been to reduce the number of meter forms required to meter the common service types. A reduction in the number of meter forms provides the advantage of reducing the different types of meter hardware that must be manufactured and inventoried. Accordingly, many of the meter forms currently used are applicable to a plurality of service types. In many instances, a single meter form may be used for a plurality of nominal voltage levels if the wiring configuration (wye or delta, three or four wire) is kept constant. This is possible because the same power calculations generally apply to all service types having the same wiring configuration regardless of the nominal voltage. For example, a 9S meter performs the same power calculations for 120, 240 and 480 volt four wire delta configurations, and is therefore compatible with all three of those service types. Likewise, it is well-known that 6S and 36S meter forms may be used for both 120 and 277 volt four wire wye service types, and further only require measurements from two of the three phases.

In addition to the reduction of meter forms, another development in electrical utility meters are electronic meters. Electronic meters replace the older inductive spinning disc meter design. Electronic meters have the advantage of providing additional features beyond straightforward power consumption metering. Electronic meters, may, for example, track energy demand, power factor, and per phase power measurements. Electronic meters are also capable of fairly sophisticated diagnostics. For example, U.S. Pat. No. 5,469,049 to Briese et al. teaches a diagnostic toolbox that is built into the meter. The diagnostic toolbox in the Briese et al. device measures per phase voltage and current magnitude and phase angles, and then compares the measured values with expected values to determine whether an error is present. In addition, electronic meters may alter their power calculations to accommodate further service types, thereby increasing the versatility of the meter forms.

The prior art electronic meters thus offer greater features and functionality than was previously available in inductive spinning disc meters. One drawback to the prior art electronic meters, however, is that some of the more advanced features require that the meter be preconfigured for the particular service type to which it is connected. For example, in the Briese et al., the service type must be programmed into the software before the meter can perform the diagnostic toolbox operations. Otherwise, the diagnostic toolbox would not be able to determine what voltage magnitude and phase angle readings are to be expected.

To provide such information, the identification of the service type may be provided as input to the meter during its manufacture (preconfiguring) or provided as input during installation by a technician. Neither solution is optimal. Preconfiguring the meter during its manufacture introduces complexity into the inventory and delivery systems, thereby reducing the efficiency that the consolidation of meter forms was intended to create. Likewise, requiring that a technician provide such input to the meter during installation undesirably increases the complexity associated with installing the meters.

SUMMARY OF THE INVENTION

The present invention overcomes these as well as other shortcomings of the prior art by automatically identifying the service type. A method according to the present invention, which is performed in an electric utility meter connected to a polyphase electrical system, comprises first obtaining measured voltage magnitude and phase angle data for a plurality of phases in a polyphase electrical system and then identifying the present electrical service type based on the measured voltage magnitude and phase angle data.

An exemplary embodiment of the present invention includes an arrangement for use in an electrical utility meter, the electrical utility meter operable to be connected to a plurality of electrical service types. The arrangement is operable to identify a present service type, the present service type being one of the plurality of electrical service types to which the electrical utility meter is connected. The arrangement comprises: a conversion circuit for obtaining measured voltage magnitude and phase angle data for a plurality of phases in a polyphase electrical system; a memory; and a processor connected to said memory and said conversion circuit. The processor is operable to execute programming steps stored in the memory to receive the measured voltage magnitude and phase angle data from the conversion circuit and identify the present electrical service type based on the measured voltage magnitude and phase angle data.

Once the service type is identified, it may then be provided on a visible display on the meter, used to configure the conversion circuit for accurate metering, or used in subsequent diagnostic routines, as well as any combination of the above.

The above features and advantages of the present invention, as well as others, will become more readily apparent to those of ordinary skill in the art by reference to the following detailed description and accompanying drawings.

DETAILED DESCRIPTION

Figure 1:
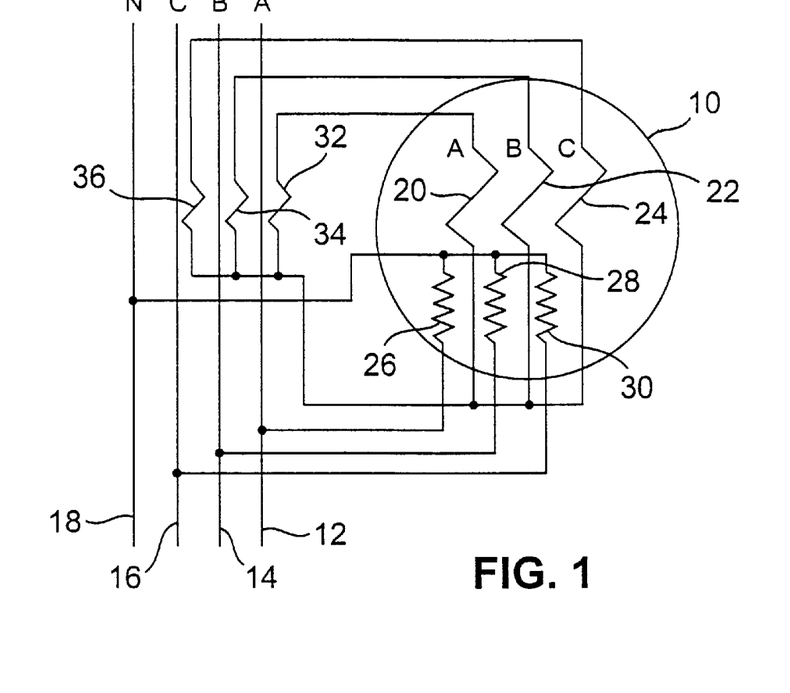
FIG. 1 shows an overview of an electrical utility meter wired for metering three phase electrical power service.

FIG. 1 shows an abstract overview of an electrical utility meter wired for metering three phase electrical power service. Shown is a meter 10, and a set of polyphase power lines including a phase A power line 12, a phase B power line 14, a phase C power line 16, and a neutral line 18. The meter 10 may suitably be a transformer-rated 9S meter form connected to a service type having a four wire wye wiring configuration. The meter 10 includes polyphase sensor means, and particularly, sensor circuitry 102 comprising a phase A current sensor 20, a phase B current sensor 22, a phase C current sensor 24, a phase A voltage sensor 26, a phase B voltage sensor 28, and a phase C voltage sensor 30. The meter 10 includes circuitry, not shown (see FIG. 2), that generates current and voltage information from the currents and voltages detected by the voltage sensors 26, 28 and 30 and the current sensors 20, 22, and 24.

The phase A current sensor 20 is connected to a first transformer 32, which is in turn operably situated to detect current on the phase A power line 12. The phase B current sensor 22 is likewise connected to a second transformer 34, which is in turn advantageously situated to detect current on the phase B power line 14. The phase C current sensor 24 is connected to an analogously-situated third transformer 36. The phase A voltage sensor 26 is connected between the phase A power line 12 and the neutral line 18. The phase B voltage sensor 28 is connected between the phase B power line 14 and the neutral line 18. The phase C voltage sensor 30 is connected between the phase C power line 16 and the neutral line 18.

Figure 1A:
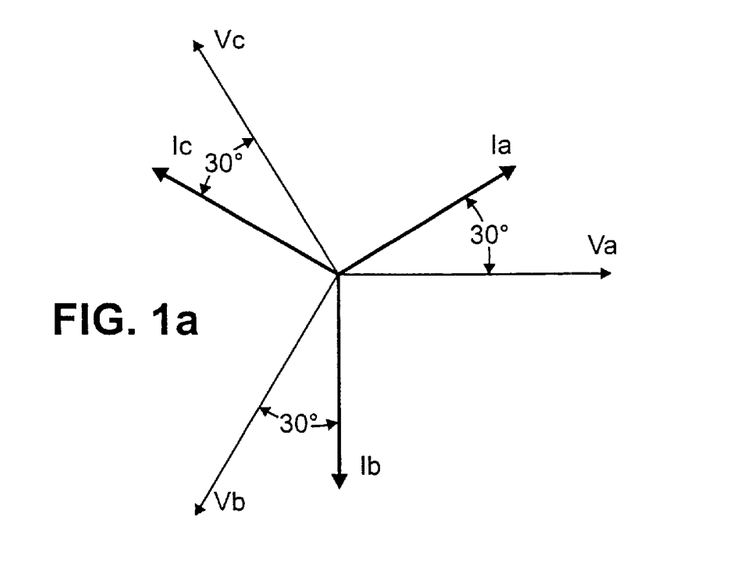
FIG. 1a shows a phasor diagram that illustrates the relationship between the three voltage and current phases in the meter wired as shown in FIG. 1.

FIG. 1a shows a phasor diagram that illustrates the relationship between the three voltage and current phases detected by the detection circuitry of the meter 10, as it is wired in FIG. 1. Typically, depending on the kind of service, the three voltage phases will typically be separated by a phase angle of approximately 120°, as will the three current phases. Each phase current and its corresponding phase voltage are typically separated by a relatively small angle, such as 30° as shown in FIG. 1a, and sometimes separated by no angle at all.

Figure 2:
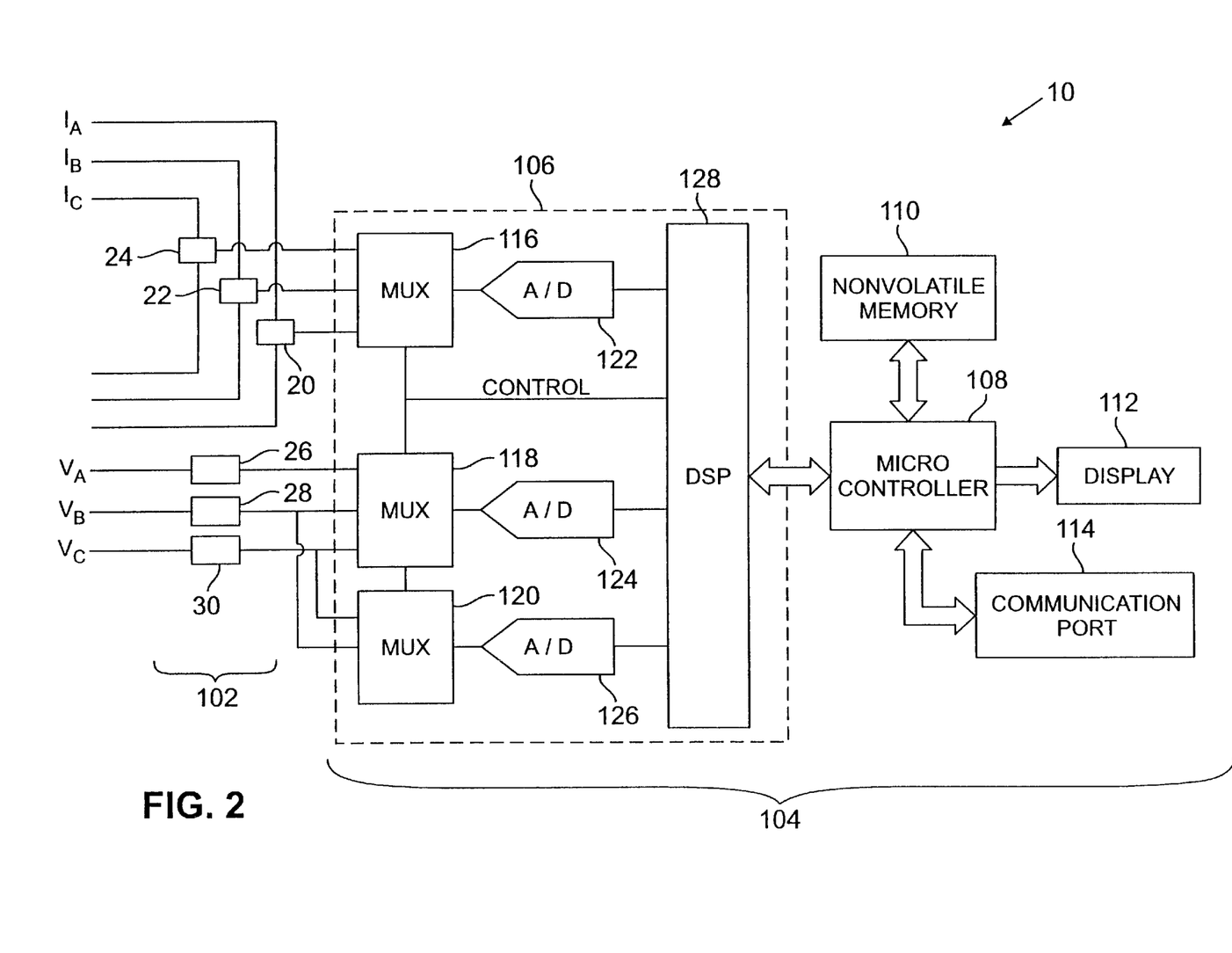
FIG. 2 shows a block diagram of an electrical utility meter according to the present invention.

FIG. 2 shows a block diagram of an electrical utility meter according to the present invention. The meter 10 essentially comprises sensor circuitry 102 and detection circuitry 104. The sensor circuitry 102 includes a polyphase current sensor, and more particularly, the phase A current sensor 20, the phase B current sensor 22, and the phase C current sensor 24 as shown in FIG. 1. The sensor circuitry 102 further includes a polyphase voltage sensor, and more particularly, the phase A voltage sensor 26, the phase B voltage sensor 28, and the phase C voltage sensor 30 as shown in FIG. 1. The measurement circuit 104 further comprises a conversion circuit 106, a processor 108, a nonvolatile memory 110, a display 112, and a communication port 114.

The phase A current sensor 20 is connected to receive a signal indicative of the current flowing through the phase A power line 12 (see FIG. 1). To this end, as shown in FIG. 1, the phase A current sensor 20 is connected to the first transformer 32, which is advantageously situated to detect current on the phase A power line 12 and produce a signal indicative of the quantity of current thereon. The phase A current sensor is further connected to the measurement circuit 104 through the first multiplexer 116. The phase A current sensor 20 may comprise a current transformer or any other device known in the art that detects current from the first transformer 32 and produces a signal indicative of the quantity of detected current. In alternative embodiments such as in a self-contained meter form, the current sensor 20 directly measures the current flowing through the phase A power line 12 and therefore the first transformer 32 would not be needed. Such a current sensor may suitably be an embedded coil sensor.

Similarly, the phase B current sensor 22 is connected to receive a signal indicative of the current flowing through the phase B power line 14 (see FIG. 1), in the manner analogous to the one discussed above in connection with phase A. The phase B current sensor 22 is further connected to the measurement circuit 104 through the first multiplexer 116. Likewise, the phase C current sensor 24 is connected to receive a signal indicative of the current flowing through the phase C power line 16 (see FIG. 1). The phase C current sensor 24 is also connected to the measurement circuit 104 through the first multiplexer 116. The phase B current sensor 22 and the phase C current sensor 24 preferably have the same structure as the phase A current sensor 20.

The phase A voltage sensor 26 is typically connected directly to the phase A power line 12 (see FIG. 1) to obtain a voltage measurement therefrom. To this end, the phase A voltage sensor 26 may suitably comprise a high resistance voltage divider. The phase A voltage sensor 26 is further connected to the measurement circuit 104 through the second multiplexer 118. The phase B voltage sensor 28 is likewise connected to obtain a voltage measurement from the phase B power line 14, and is further connected to provide the voltage measurement to the second multiplexer 118. The phase C voltage sensor 30 has a similar structure and is connected to the phase C power line 16 and the multiplexer 118 in an analogous manner as the phase A voltage sensor 26 and the phase B voltage sensor 28.

The conversion circuit 106 is a circuit operable to receive polyphase voltage and polyphase current measurement signals and generate digital data therefrom, the digital data including power consumption data and measured voltage and current amplitude and phase angle data. In the exemplary embodiment described herein, the conversion circuit comprises first, second and third multiplexers, 116, 118, and 120, respectively, first, second, and third analog to digital converters ("A/Ds") 122, 124 and 126, respectively, and a digital signal processor 128. The above listed components of the conversion circuit may suitably be incorporated onto a single semiconductor substrate. An example of a suitable conversion circuit is the Power Measurement Integrated Circuit found in a model S4 electrical utility meters available from Landis & Gyr Utility Services, Inc.

The controller 108 is operably configured to, and executes programming instructions to, receive the digital data from the conversion circuit, monitor and record power consumption using the digital data, and identify the service type to which the meter 10 is connected using the digital data. The controller 108 may suitably be a K0 series microcontroller available from NEC. The controller 108 generally includes firmware, or in other words, an integrated memory into which programming instructions are stored. Alternatively, the programming instructions may be stored in the nonvolatile memory 110.

The third multiplexer 120 and third A/D 126 provide additional capabilities to the meter 10 that are outside the scope of the present invention.

In operation, the phase A, B and C current sensors 20, 22, and 24, respectively, detect the phase A current, the phase B current, and the phase C current. The phase A current sensor 20 provides a phase A current measurement signal to the first multiplexer 116, the phase B current sensor 22 provides a phase B current measurement signal to the first multiplexer 116, and the phase C current sensor 24 provides a phase C current measurement signal to the first multiplexer 116. The current measurement signal typically is a signal having a voltage level that is indicative of the instantaneous current level on its respective phase. For current transformers designed for utility meter use, the current measurement signals measure from 0.0 Vrms to 0.3 Vrms maximum. Other scaling factors may of course be employed.

The first multiplexer 116, under the control of the controller 108, then provides the instantaneous current measurement signal from one of the phase A, phase B, or phase C current measurement signals to the first A/D converter 122. The first multiplexer 116 typically provides each phase in a rapid succession of cycles, such that each phase is provided to the first A/D converter 122 every third cycle. According to the exemplary embodiment described herein, the first multiplexer 116 provides the current measurement signals at a cycle rate of 3.3 kHz.

The first A/D converter 122 receives and samples or digitizes the rapid succession of instantaneous current measurement signals. The first A/D converter 122 then provides to the DSP 128 a stream of digital words, each representing the magnitude of one of the three phase currents at a particular instant. The stream of digital words provided by the first A/D converter 122 is referred to herein as the digital current measurement signal.

Contemporaneously, the phase A, B and C voltage sensors 26, 28, and 30, respectively, detect the phase A voltage, the phase B voltage, and the phase C voltage. The phase A voltage sensor 26 provides a phase A voltage measurement signal to the second multiplexer 118, the phase B voltage sensor 28 provides a phase B voltage measurement signal to the second multiplexer 118, and the phase C voltage sensor 30 provides a phase C current measurement signal to the second multiplexer 116. Each voltage measurement signal is typically a signal having a voltage level that is indicative of the instantaneous voltage level on its respective phase. In the exemplary embodiment described herein, the voltage sensors are configured to provide voltage measurement signals that range from 0.0 Vrms to 0.3 Vrms maximum. Other scaling factors may of course be employed.

The second multiplexer 118 then provides, one at a time, the instantaneous phase A, phase B, or phase C voltage measurement signals to the second A/D converter 124. To this end, the second multiplexer 118 is controlled by the controller 108. The second multiplexer 118 typically provides each phase voltage measurement signal in a rapid succession of cycles, such that each phase is provided to the second A/D converter 124 every third cycle. According to the exemplary embodiment described herein, the second multiplexer 118 provides the voltage measurement signals at the same rate as that used by the first multiplexer 116 to provide the current measurement signals to the first A/D converter 122. Moreover, the first multiplexer 116 and the second multiplexer 118 operate in a coordinated fashion to provide certain phase current measurement signals at the same time as certain phase voltage measurement signals. For example, in a four wire wye meter configuration, the first multiplexer 116 provides the phase x current measurement signal and the second multiplexer 118 provides the phase x voltage measurement signal contemporaneously, where x rotates among A, B and C. In any event, the second A/D converter 124 receives and samples or digitizes the rapid succession of instantaneous voltage measurement signals. The second A/D converter 124 thus provides a stream of digital words, or digital voltage measurement signal, to the DSP 128. The first A/D converter 122 and the second A/D converter 124 therefore provide the digital voltage and current measurement signals in a predetermined coordinated phase relationship.

The DSP 128 within the conversion circuit 106 determines power consumption by selectively multiplying the digitized polyphase voltages and the polyphase currents received from the A/D converters 122 and 124, and then adding them together. For example, in a four wire wye configuration, the appropriate power calculation is:

$$\text{POWER} = V_A I_A + V_B I_B + V_C I_C, \tag{1}$$

Where POWER is given in watts.

The DSP 128 carries out the above calculation in the manner described herebelow. The DSP 128 receives the digital current and voltage measurement for each phase contemporaneously and multiplies them together. The resulting product is added to a running total or sum. In other words, if $\text{DIG\_VOLT}_x$ is digital voltage measurement signal for a phase x and $\text{DIG\_CURR}_x$ is the digital current measurement signal for the phase x, then the DSP 128 carries out the following calculation:

$$\text{POWER} = \text{SUM} (\text{DIG\_VOLT}_x * \text{DIG\_CURR}_x) \text{ for } x=\{A, B, C, A, B, \ldots\} \quad (2)$$

The DSP 128 provides power measurement data to the processor 108 at regular time intervals, the power measurement data consisting of the POWER sum for each time interval. The processor 108 then accumulates the power measurement data until a predefined watt-hour unit threshold has been reached. Once a predefined watt-hour unit threshold has been reached, the processor 108 generates a power consumption pulse and then increments a power consumption counter. The processor 108 then begins accumulating power measurement data and repeats the process.

The power consumption counter is the means by which customer energy consumption is tracked. For example, as is well known, a utility may determine a particular customer's consumption for a particular billing cycle by subtracting the power consumption counter value at the beginning of the billing cycle from the power consumption counter value at the end of the billing cycle. The processor 108 preferably provides the power consumption counter information to both the nonvolatile memory 110 and the display 112. The display 112 then provides a visual representation of the power consumption counter information from which readings may be taken by utility personnel. The nonvolatile memory 110 stores the power consumption counter information for the purposes of retention in the case of a power interruption.

Optionally, the processor 108 further provides the power consumption counter information, as well as other information, to the communication port 114. The communication port 114 may then communicate the information over an external communication means, such as a public telephone network, to a central processing facility for the utility. In this manner, the utility may track and bill for power consumption registered by the meter 10 without requiring an employee to physically view the meter.

The processor 108 additionally has the capability of providing alternative power information, such as VAs, VARs and power factor. The VA quantity is a well known power consumption quantity that is, in some circumstances, more accurate than measured watts in quantifying the electric power actually consumed by a customer. The processor 108 is operable to determine such alternative power information, including VAs, using methods well known in the art.

The processor 108 also generally controls the operation of the conversion circuit 106, and particularly, the first, second, and third multiplexers 116, 118 and 120, respectively, the first, second, and third A/D converters 122, 124 and 126, respectively, and the digital signal processor 128. To this end, the processor provides timing signals and other control signals to the various elements of the conversion circuit 106 as necessary to carry out the operations described above.

In addition to the power consumption data, the DSP 128 also determines and provides other information to the processor 108. In particular, the DSP 128 provides for each phase, the measured voltage magnitude and phase angle data, and the measured current magnitude and phase angle data.

To determine the measured voltage and current magnitude data, the DSP 128 performs an RMS calculation on each digital voltage and current measurement signal. This calculation may, for example, include, for each phase voltage and current, multiplying each sample of the digital measurement signal by itself and taking the mean over time.

To determine phase angle data for each phase voltage, the DSP 128 determines the time differences between the zero crossings of the voltage signals. The time difference between the zero crossing of a particular signal and the $V_A$ signal, plus the direction of the respective zero crossings, provides the phase information. For example, the phase angle of $V_B$ is measured by obtaining the difference in time of the zero crossings between $V_A$ and $V_B$, as well as the direction of the crossing.

To determine phase angle data for each phase current, the DSP 128 determines the watts$_x$ and the VAR$_x$ for each phase x. Watts per phase is calculated using the power calculation based on the product of DIG_VOLT$_x$ and DIG_CURR$_x$ for each phase x. VAR per phase is calculated based on the product of DIG_VOLT$_x$ and DIG_CURR$_x$(−90°) for each phase x, where DIG_CURR$_x$ (−90°) is the digital current measurement signal time-delayed by ¼ of a cycle or 90°. In the exemplary embodiment herein, the VAR$_x$ and Watt$_x$ data constitutes the measured phase angle data provided by the DSP 128. The processor 108, as described below, actually calculates the measured phase angle values from this data.

The DSP 128 provides the measured voltage and current magnitude and phase angle data to the processor 108. The processor 108 then determines measured voltage and current magnitude and phase angle values from the measured voltage and current magnitude and phase angle data. Table 1, below shows each measured value determined by the processor 108.

Table 1

VRMS$_A$ = Phase A voltage magnitude
VRMS$_B$ = Phase B voltage magnitude
VRMS$_C$ = Phase C voltage magnitude
IRMS$_A$ = Phase A current magnitude
IRMS$_B$ = Phase B current magnitude
IRMS$_C$ = Phase C current magnitude
V<$_A$ = Phase A voltage phase angle
V<$_B$ = Phase B voltage phase angle
V<$_C$ = Phase C voltage phase angle
I<$_A$ = Phase A current phase angle
I<$_B$ = Phase B current phase angle
I<$_C$ = Phase C current phase angle It is noted that the processor need not perform further calculations to the measured voltage and current magnitude data to obtain the measured values, as the DSP 128 has already provided the data in RMS magnitude format. However, in the present embodiment, the processor 108 must perform further calculations to determine the measured voltage and current phase angle values from the measured voltage and current phase angle data. In particular, the measured voltage phase angle voltage data consists of a series of zero crossings which are converted to phase angle values. Those of ordinary skill in the art could readily program the processor 108 to perform such a conversion. In addition, the measured current phase angle data consists of VAR$_x$ and Watts$_x$, which the processor 108 converts to phase angle values using the equation I<$_x$=arctan (VAR$_x$/Watts$_x$). Alternatively, it is contemplated that the DSP 128 could simply provide the measured voltage and current phase angle data in the measured value format shown in Table 1.

In any event, as will become more readily apparent below, the processor 108 employs at least some of the above measured values, and in particular, the measured voltage magnitude and phase angle values, to determine the service type.

Figure 3:
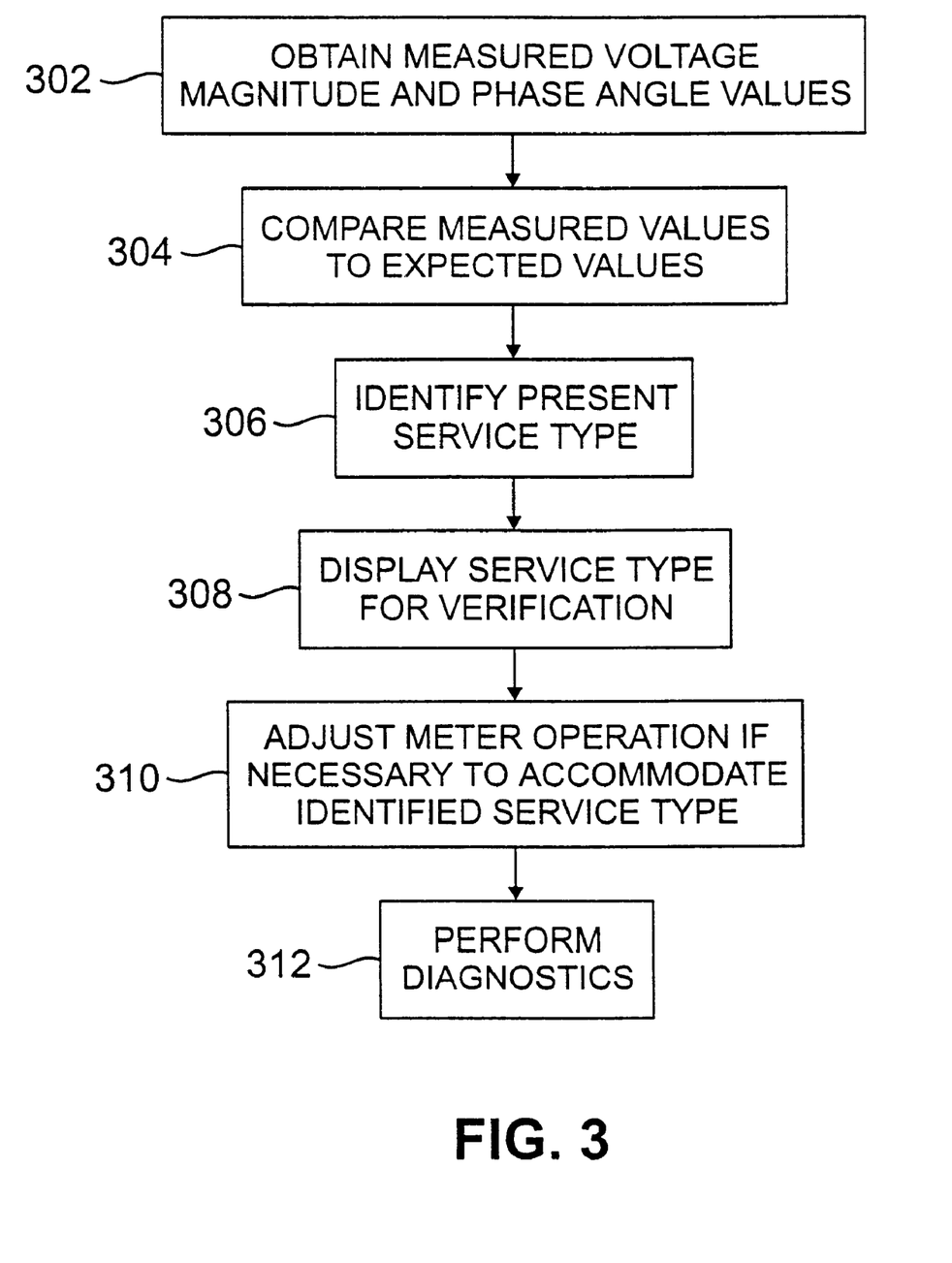
FIG. 3 shows a flow diagram of the general operations of a processor of an electrical utility meter according to the present invention.

FIG. 3 shows a flow diagram 300 of the general operations of the processor 108 in identifying the service type to which the processor is connected. Additionally, the operations in flow diagram 300 may be executed by any processor in an electronic meter that is connected to a conversion circuit, wherein the conversion circuit provides measured voltage magnitude and phase angle data for each phase of a polyphase system. Consequently, the generic term processor is used instead of specifically referencing the processor 108 from FIG. 2.

The processor may suitably perform the steps in flow diagram 300 upon power-up of the meter, either initially or after a power service interruption. As will be seen in the exemplary embodiment described in FIGS. 4 and 5 below, the processor may also recheck the meter form at regular time intervals.

Figure 6:
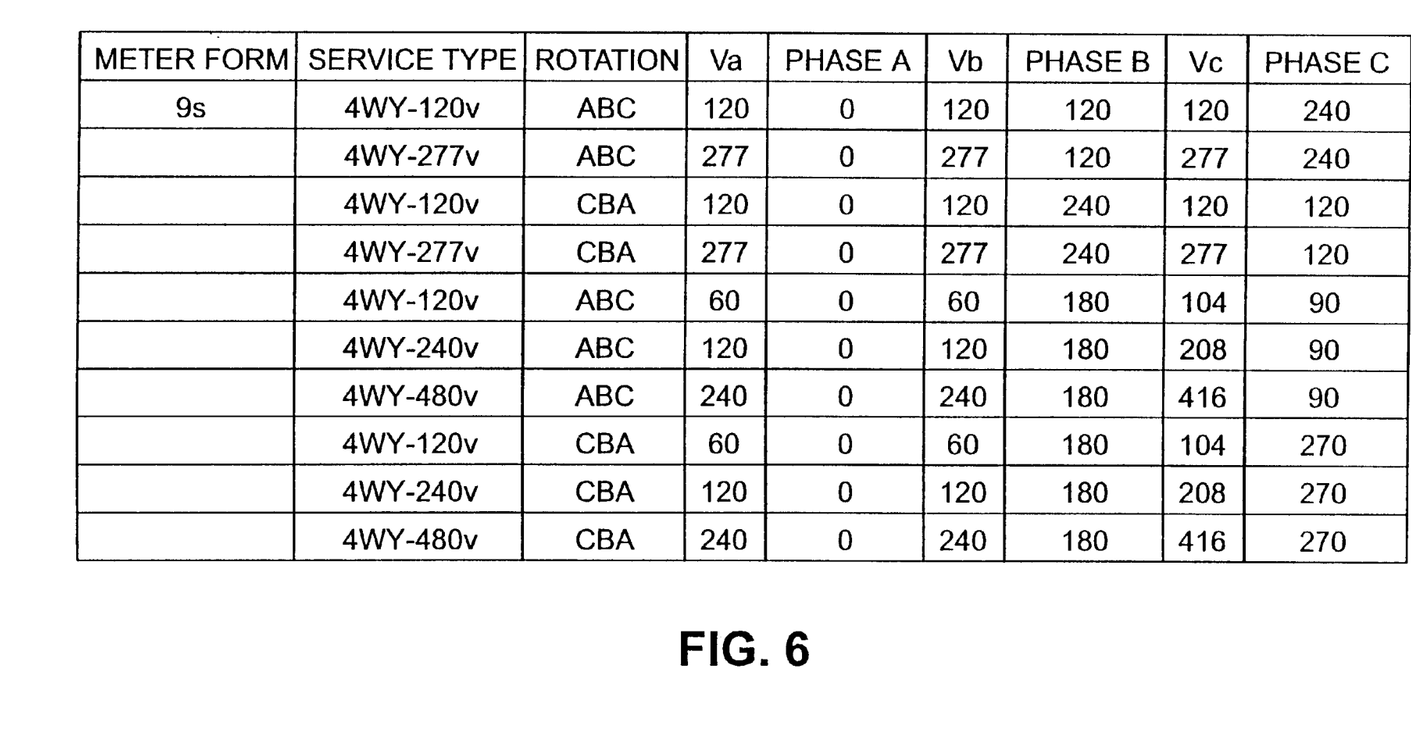
FIG. 6 shows a table of possible service types and the corresponding sets of expected voltage magnitude and phase angle values that are applicable to a meter having a 9S meter form.

The meter typically performs normal metering functions, in other words, recording energy consumption information as described above in connection with FIG. 2, immediately after power-up, using a default power calculation. After power-up, the processor in step 302 first obtains measured voltage magnitude and phase angle data for a plurality of phases in a polyphase electrical system. Then in step 304, the processor compares the measured voltage magnitude and phase angle data to expected values for a plurality of electrical service types. The expected values comprises sets of voltage magnitude and phase angles for a plurality of service types. FIG. 6 shows an exemplary table of sets of expected values and their corresponding service types. The expected values may be stored in nonvolatile memory within the processor itself or an external memory, such as the nonvolatile memory 110 of FIG. 2.

The comparison of the measured data with the expected values will, under normal operating conditions, yield a match. Accordingly, in step 306, the processor identifies the present electrical service type based on the comparison of the measured voltage magnitude and phase angle data and the expected values. Once the service type is known, the processor causes a display, such as, for example, the display 112 of FIG. 2, to display the service type in step 308. If the meter is a newly-connected meter, the display may optionally prompt the installer to verify that the proper service type has been detected.

Thereafter, in step 310 the processor effectuates any adjustments that are necessary to accommodate the service type. To this end, the processor in step 310 may alter its own power calculations or adjust the conversion circuit, if necessary, to improve the metering accuracy once the service type has been identified.

For example, consider a 9S meter that can meter both four wire delta and four wire wye wiring configurations. $VA_{RMS}$, which is often measured by utilities, is calculated slightly differently in four wire delta and four wire wye wiring configurations. In four wire wye wiring configurations, $VA_{RMS}$=SUM ($VRMS_x$*$IRMS_x$) where x={A, B, C}, while in four wire delta configurations, $VA_{RMS}$=0.93*SUM ($VRMS_x$*$IRMS_x$) where x={A, B, C}. Accordingly, if the processor uses a default $VA_{RMS}$ power calculation intended for four wire wye service, and the processor determines in step 306 that the present service type has a four wire delta wiring configuration, then the processor adjusts itself to adopt the appropriate power calculation. Alternatively, the processor may provide control signals to the conversion circuit to effectuate the adjustment. It is further noted that the $VA_{RMS}$ calculation for three wire delta wiring configurations differs from that of the three wire wye configuration by a factor of 0.866. Accordingly, similar adjustments may be made in meter forms that meter both of those wiring configurations.

After the meter is adjusted if necessary, it continues to perform normal metering functions. During normal metering functions, the processor may from time to time performs diagnostics routines, as shown in step 312. Diagnostic routines may be used to detect several error situations, including those caused by current transformer failures, disconnection of one or more phases, and miswiring. The model S4 meter available from Landis & Gyr includes an exemplary diagnostic functionality. In any event, diagnostic routines reference the predetermined voltage (and sometimes current) ranges corresponding to the present service type to determine whether an error exists. In particular, the processor determines whether the measured data for $VRMS_A$, $VRMS_B$, $VRMS_C$, $V<_A$, V<hd B, and $V<_C$, fall within acceptable ranges for those variables, wherein the ranges correspond to the service type. Some diagnostic routines may further require analysis of the measured current magnitude and/or current phase data as well.

For example, in a 120V four wire wye service type, the expected values (with tolerances) are: $VRMS_A$=$VRMS_B$=$VRMS_C$=120 Volts (with a tolerance 96–138 Volts); $V<_A$=0° (reference); $V<_B$=120°+/−10°; and $V<_C$=240°+/−10°. If the measured data for $VRMS_A$, $VRMS_B$, $VRMS_C$, $V<_A$, $V<_B$, and $V<_C$ are all within the expected ranges, then the meter will continue to perform ordinary metering calculations as described above in connection with FIG. 2. If, however, any of the measured data is not within the expected ranges, an error is indicated. For example, if the measured data for $V<_B$ is not between 110° and 130°, but rather has a value of 305°, then the measured data for V<B is approximately 180° out of phase, and may signify that the phase B voltage sensor has been reverse-wired.

Another electric utility metering diagnostic system is disclosed in U.S. Pat. No. 5,469,049, issued to Briese et al. That system also measures voltage magnitudes and phase angles, albeit in a different manner, and performs diagnostics using those values. Accordingly, the present invention may alternatively incorporate a diagnostic system as described in U.S. Pat No. 5,469,049.

Figure 4:
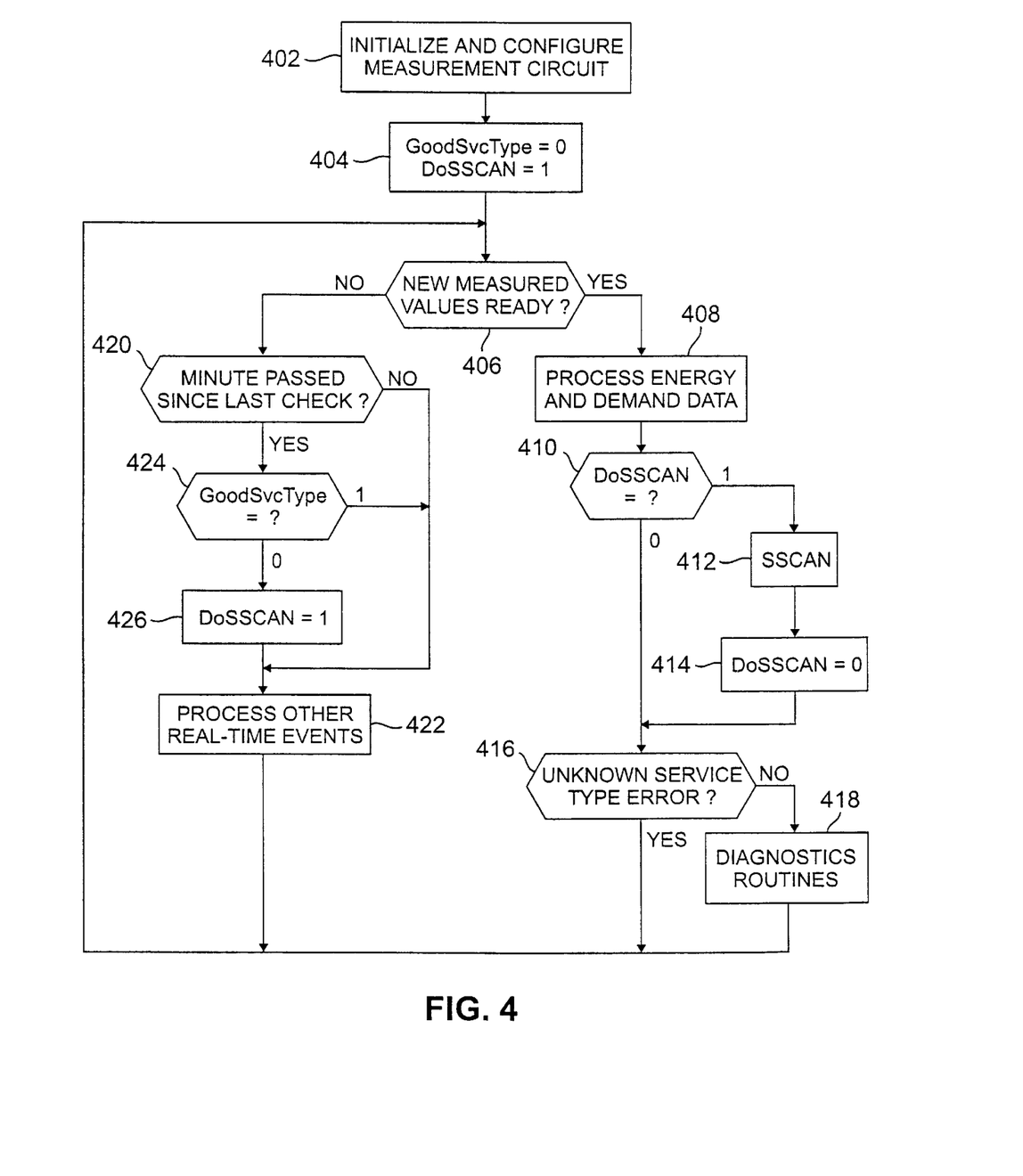
FIG. 4 shows a more detailed flow diagram of the operations performed by a processor of an electrical utility meter in a particular embodiment of the present invention.
Figure 5:
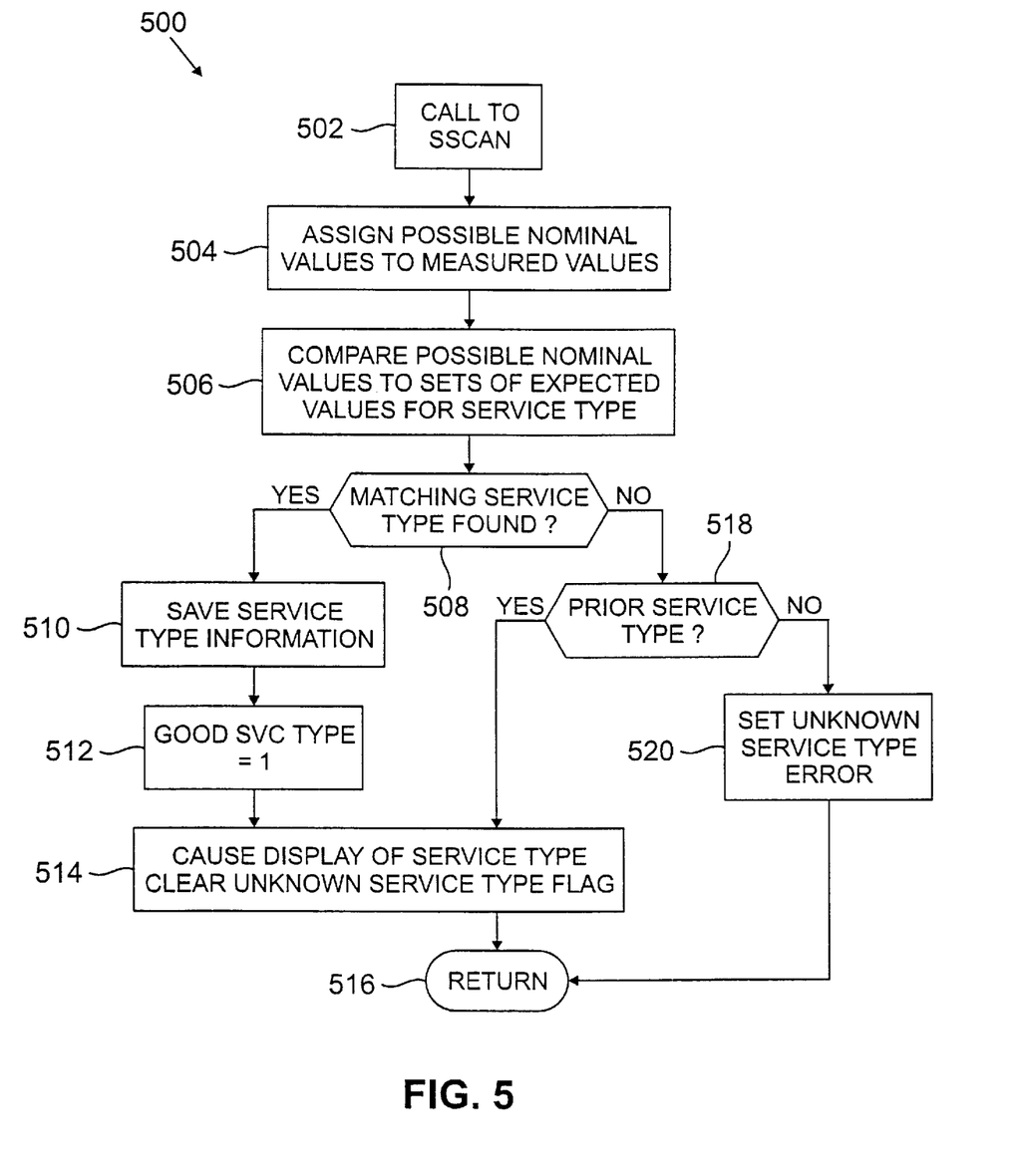
FIG. 5 shows a detailed flow diagram of the operations performed by a processor of an electrical utility meter to identify the service type to which the electrical utility meter is connected.

FIGS. 4 and 5 illustrate in further detail the operations of the processor in an exemplary implementation of the present invention. In this exemplary implementation, the processor is utilized in a meter having a 9S meter form. In general, the operations described below are equally applicable to other meter forms, requiring only minor modifications.

FIG. 4 shows the main operational loop of the processor. FIG. 5 shows a routine entitled SSCAN that performs the automatic service type identification operation according to the present invention. FIGS. 4 and 5 illustrate, among other things, one way in which the steps described above in connection with FIG. 3 operate in the context of other metering operations.

Referring specifically to FIG. 4, after power up, the processor initializes the measurement circuit of the meter, such as the measurement circuit 104, and particularly the conversion circuit 106, of FIG. 2 (step 402). The processor configures the measurement circuit to perform power calculations appropriate for a default wiring configuration. In this example, the processor may configure the measurement circuit of the 9S meter to perform measurements and power calculations for four wire wye wiring configurations. In other embodiments, including those involving other meter forms, the processor may of course configure the measurement circuit to perform measurements and power calculations for a different wiring configuration.

Once the measurement circuit is initialized, the processor sets two flags: GoodSvcType=0, representing that a good service type has not yet been identified; and DoSSCAN=1, representing that SSCAN is to be performed (step 404). The processor then begins the main loop. In the first step of the main loop (step 406), the processor determines whether new measured voltage (and current) magnitude and phase angle data, or simply measured data, is ready. New measured data is typically provided by the conversion circuit every 300 milliseconds. The 300 millisecond time frame allows for sufficient voltage samples to be accumulated to perform characteristic RMS magnitude calculations.

If new measured data is ready, then the processor next processes various energy and demand variables (step 408). Electronic meters today often offer capabilities for measuring many aspects of the metered energy demand. The various energy and demand variables required to provide these capabilities are typically updated when each set of new measured data become available.

After the energy and demand variables have been processed, the processor determines the status of the DoSSCAN flag (step 410). If the flag is set (1), then the processor performs the SSCAN routine (step 412). The SSCAN routine of step 412 attempts to determine the service type using the measured voltage magnitude and phase data, as described further below in connection with FIG. 5. When the SSCAN routine has been completed, the processor resets the SSCAN flag to 0 (step 414) and proceeds to step 416. Referring again to step 410, if the processor determines that the SSCAN flag is cleared (0), then the processor proceeds directly to step 416.

In step 416, the processor determines whether there is an unknown service type error. As is described in further detail in connection with FIG. 5, an unknown service type error exists if SSCAN was not able to determine any applicable service type. If there is not an unknown service type error, then the processor may use the known service type to perform diagnostic routines (step 418), and return to the beginning of the main loop (step 406). The diagnostic routines are discussed in further detail above in connection with step 312 of FIG. 3. If there is an unknown service type error, then the processor skips the diagnostics and returns directly from step 416 to step 406.

Referring again to step 406, if the processor determines that new measured data is not ready, then the processor instead executes one or more real time threads or events. The real time events include operations performed by the processor at specified or regular time intervals. One such real time event is an SSCAN recheck, which in the present embodiment occurs every minute. SSCAN is preferably rechecked every minute in order to provide a time cushion during meter power-up. For example, in heavy duty meter forms, such as 480 volt four wire delta forms, the meter may take several minutes to power-up, and is powered up one phase at a time. Once the first phase (phase A) is powered up, the processor powers up and may attempt to perform SSCAN several minutes before the other phases are operational. The SSCAN recheck effectively erases or clears any unknown service type error once all the phases are powered up.

In any event, if new measured data is not ready, the processor first determines whether a minute has passed since the last SSCAN recheck (step 420). If not, then the processor skips the SSCAN recheck proceeds to execute other real time events (step 422). If, however, a minute has passed since the last SSCAN recheck, then the processor determines the status of the GoodSvcType flag (step 424). If the GoodSvcType flag is set (1), then the SSCAN routine need not be executed, and the processor proceeds to execute other real time events (step 422). If, however, the GoodSvcType flag is cleared (0), indicating that the service type has not yet been correctly identified, then the processor sets the DoSSCAN flag to 1 (step 426). With the DoSSCAN flag set, the processor will execute SSCAN after the next time the processor executes step 410. In any event, after step 426, the processor proceeds to execute the other real-time events (step 422).

The other real-time events include other routines that the processor performs at regular time intervals. For example, diagnostic routines such as the ones described above in connection with step 418 may be executed at regular time intervals during the main loop operations of the processor. The identity and details of other real-time events are outside the scope of the invention, and are mentioned only to place the operations described herein in proper context for this embodiment of the present invention.

After the processor executes the other real-time events, if any, then the processor returns to the beginning of the main loop (step 406) and proceeds accordingly.

FIG. 5 describes in further detail the SSCAN routine 500 executed by the processor in the exemplary implementation described above in connection with FIG. 4. The SSCAN routine 500 is called by step 412 of FIG. 4, which causes the SSCAN routine 500 to begin (step 502). It is noted that as an initial matter, the new measured data should be converted into the proper format for the measured values listed in Table 1, if the conversion circuit has not already provided the information in that format. The properly formatted data is properly referred to herein as measured values.

In any event, the processor assigns one or more possible nominal values to each measured value, i.e., $VRMS_X$ and $V<_X$ where X={A, B, C} (step 504). The possible nominal values comprise a list of nominal values for voltage magnitudes and phase angles that correspond to most, if not all, potential service types. Because in real world applications, measured voltage magnitudes are seldom precisely equal the nominal voltage magnitude value for the service type, the processor converts the measured values into likely candidates for nominal values. Table 2, below, shows the correlation between measured voltage magnitude values and the possible nominal values.

TABLE 2

| Measured Voltage Value | Possible Nominal Voltage Value |
|---|---|
| 0 . . . 10 | 0 V |
| 48 . . . 69 | 60 V |
| 83 . . . 120 | 104 V |
| 96 . . . 138 | 120 V |
| 166 . . . 239 | 208 V |
| 192 . . . 276 | 240 V |
| 221 . . . 319 | 277 V |
| 332 . . . 478 | 416 V |
| 384 . . . 552 | 480 V |

Thus, for example, a measured voltage magnitude value of 127 Vrms is assigned a possible nominal voltage of 120 Vrms. Some measured voltage magnitude values are within the range of two or more possible nominal values. For example, a measured value of 110 Vrms correlates to a possible nominal voltage of both 104 Vrms and 120 Vrms. Such a reading would be assigned both possible nominal values.

Table 3 below shows the correlation between measured phase angle values and possible nominal values.

TABLE 3

| Measured Phase Angle Value | Possible Nominal Angle Value |
|---|---|
| 0 ... 10° | 0° |
| 50 ... 70° | 60° |
| 80 ... 100° | 90° |
| 110 ... 130° | 120° |
| 170 ... 190° | 180° |
| 230 ... 250° | 240° |
| 260 ... 280° | 270° |
| 290 ... 310° | 300° |

Once possible nominal values are assigned, then the processor compares the possible nominal values with sets of expected values for a plurality of service types to determine whether there is a match between the possible nominal values and a particular service type (step 506). FIG. 6 shows a table of expected values for a plurality of service types that may be measured by a 9S meter. The processor uses any suitable searching algorithm to determine whether all six values of a set of expected values associated with a service type are matched by any possible group of the nominal values. Although there may be more than one possible nominal value for one or more measured voltage magnitude values, it will be appreciated that no set of possible nominal values can ever match the set of expected values associated with more than one service type.

Once the comparison is done, the processor determines whether a matching service type was found (step 508).

If a service type match was found in step 506, then the processor saves the information regarding the identified service type (step 510). The processor then sets the GoodSvcType flag to 1 (step 512). The processor thereafter provides the appropriate signals to cause a meter display, such as the display 112 of FIG. 2, to display the service type (step 514). As described above, the processor may also cause the display to request verification by a service person. The processor also clears the unknown service type error flag, if any, in step 514, which enables diagnostics to be performed as shown in FIG. 4. The processor may then return from SSCAN to the operations in FIG. 4 (step 516).

Referring again to step 508, if a service type match is not found in step 506, then the processor determines whether a prior service type has been saved (step 518). A saved prior service type will exist if the meter has previously successfully determined a service type. Thus, for example, if the processor executes step 518 during the first time SSCAN is executed for the meter, then the answer in step 518 will be "no".

If the answer in step 518 is "no", then the processor sets the unknown service type error flag (step 520). The unknown service type error flag represents a situation in which the processor could neither determine a service type in step 506 nor retrieve a saved prior service type in step 518. In such a situation, the meter is extremely limited in its ability to perform diagnostics. Once the unknown service type flag is set, the processor may then return to the point at which SSCAN was called (step 516).

If, however, the answer in step 518 is "yes", then the processor then proceeds to step 514 and treats the saved prior service type as the present service type. The answer in step 518 may be "yes" if SSCAN is executed after a power service interruption that cause the meter or service wiring to be corrupted. In such a situation, the SSCAN routine would not be able to recognize the service type in step 506 because of the wiring corruption, but in step 518 would identify a stored prior service type that was recognized before the wiring corruption. In such a case, the processor executes step 514, as discussed above, and proceeds accordingly.

Thus, the present invention thus provides a method and arrangement for use in an electrical utility meter that automatically determines the service type to which the meter is connected. Accordingly, the service type may be displayed or used for diagnostics or to configure the meter without requiring the preconfiguration of the meter at the factory or by installation personnel.

It will be appreciated that the above configuration may readily be modified to accommodate other meter forms. As an initial matter, those of ordinary skill in the art may modify the measurement circuit 104 of FIG. 2 to perform the appropriate power calculation for other meter forms. To employ the service type recognition method described in FIGS. 4 and 5 in other meter forms, a substantially similar flow diagram may be implemented. It will be necessary, of course, to modify FIG. 6, described above, to include sets of expected values for all of the possible service types applicable to the meter form. Those of ordinary skill in the art would know the possible service types for all of the standard meter forms, and would further know the expected values for such service types.

Meter forms can also have a variety of physical interconnection means. The alphabetical suffix indicates the type of interconnection means. For example, an S-type meter, such as the 9S and 6S meters discussed above, utilize a standardized plug and socket combination to connect the meter to the power lines being metered. There are also B-suffixed meter forms, for example, in 5B, 6B, 9B meter forms, that are similar to the S-suffixed meter types except that they utilize different interconnection means. The present invention may readily be incorporated into meter forms having alternative interconnection means.

It is to be noted that the above embodiments are merely illustrative. Those of ordinary skill in the art may readily devise their own implementations that incorporate the principles of the present invention which fall within the spirit and scope thereof.

We claim:

1. In an electrical utility meter, the electrical utility meter operable to measure power consumption, a method of identifying a present electrical service type, the method comprising:
    a) obtaining measured voltage phase angle data based on a time difference between a first zero crossing of a first voltage measurement signal from a first phase of a polyphase electrical system and a second zero crossing of a second voltage measurement signal from a second phase of a polyphase electrical system; and
    b) automatically identifying the present electrical service type based at least in part on the measured phase angle data.

2. The method of claim 1 further comprising the step of displaying information identifying the present electrical service type.

3. The method of claim 2 further comprising the step of using the meter display to request an operator for verification of the present electrical service type.

4. The method of claim 1 further comprising the step of using the present electrical service type in subsequent electric utility meter diagnostic operations.

5. The method of claim 1 further comprising the step of performing an adjustment on the electrical utility meter, the adjustment corresponding to the present electrical service type, the adjustment increasing a metering accuracy of the electrical utility meter.

6. In an electrical utility meter, the electrical utility meter operable to measure power consumption, a method of identifying a present electrical service type, the method comprising:

a) obtaining measured voltage phase angle data for a plurality of phases in a polyphase electrical system;

b) automatically identifying the present electrical service type based at least in part on the measured voltage phase angle data;

c) displaying information identifying the present electrical service type on a meter display.

7. The method of claim 6 further comprising the step of displaying information identifying the present electrical service type.

8. The method of claim 7 further comprising the step of using the meter display to request an operator for verification of the present electrical service type.

9. The method of claim 8 wherein:

step a) further comprises obtaining measured voltage magnitude data for the plurality of phases of the polyphase electrical system; and step b) further comprises automatically identifying the present electrical service type based at least in part on the measured voltage magnitude data.

10. The method of claim 6 further comprising the step of using the present electrical service type in subsequent electric utility meter diagnostic operations.

11. The method of claim 6 further comprising the step of performing an adjustment on the electrical utility meter, the adjustment corresponding to the present electrical service type, the adjustment increasing a metering accuracy of the electrical utility meter.

12. An arrangement for use in an electrical utility meter, the electrical utility meter operable to be connected to a plurality of electrical service types, the arrangement operable to identify a present service type, the present service type being one of the plurality of electrical service types to which the electrical utility meter is connected, the arrangement comprising:

a) a conversion circuit for obtaining measured voltage magnitude and phase angle data for a plurality of phases in a polyphase electrical system;

b) a memory;

c) a display;

d) a processor connected to each of the memory, the conversion circuit, and the display, the processor operable to execute programming steps stored in the memory to receive measured voltage phase angle data from the conversion circuit, identify the present service type based on the measured voltage magnitude and phase angle data, and cause the display to display the information identifying the present electrical service type.

13. The arrangement of claim 12 wherein the processor is further operable to execute programming steps stored in memory to request an operator for verification of the present service type.

14. The arrangement of claim 13 wherein the processor is further operable to execute programming steps stored in memory to:

obtain measured voltage magnitude data for the plurality of phases of the polyphase electrical system; and identify the present electrical service type based at least in part on the measured voltage magnitude data.

15. The arrangement of claim 12 wherein the processor is further operable to execute programming steps stored in memory to perform an adjustment on the electrical utility meter, the adjustment corresponding to the present electrical service type, the adjustment increasing a metering accuracy of the electrical utility meter.

* * * * *